(12) United States Patent
Kamiya

(10) Patent No.: US 6,755,677 B2
(45) Date of Patent: Jun. 29, 2004

(54) ELECTRONIC CIRCUIT UNIT HAVING A PENETRATION-TYPE CONNECTOR HOUSING

(75) Inventor: Arihiro Kamiya, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/292,623

(22) Filed: Nov. 13, 2002

(65) Prior Publication Data

US 2003/0162434 A1 Aug. 28, 2003

(30) Foreign Application Priority Data

Feb. 19, 2002 (JP) ........................................ 2002-041333

(51) Int. Cl.⁷ ........................ H01R 13/64; H01R 12/00; H05K 1/00
(52) U.S. Cl. ...................................... 439/381; 439/76.2
(58) Field of Search ............................... 439/381, 76.2

(56) References Cited

U.S. PATENT DOCUMENTS 6,325,642 B2 * 12/2001 Asao .......................... 439/76.2

FOREIGN PATENT DOCUMENTS

| JP | A-9-180831 | 11/1997 |
| JP | A-10-223335 | 8/1998 |

* cited by examiner

Primary Examiner—Chandrika Prasad
(74) Attorney, Agent, or Firm—Posz & Bethards, PLC

(57) ABSTRACT

In an electronic circuit unit having more than two electric connectors, at least one of the connectors gets to have a group of connector pins, penetration-type connector housing, which the group of connector pins can be passed through with clearances, a plate to support the connector pins. This connector can be installed in the printed wiring board easily. Especially, when the electronic circuit unit has many electric connectors and some connectors are the above type, they can be installed in the printed wiring board easily and securely at the same time.

10 Claims, 2 Drawing Sheets

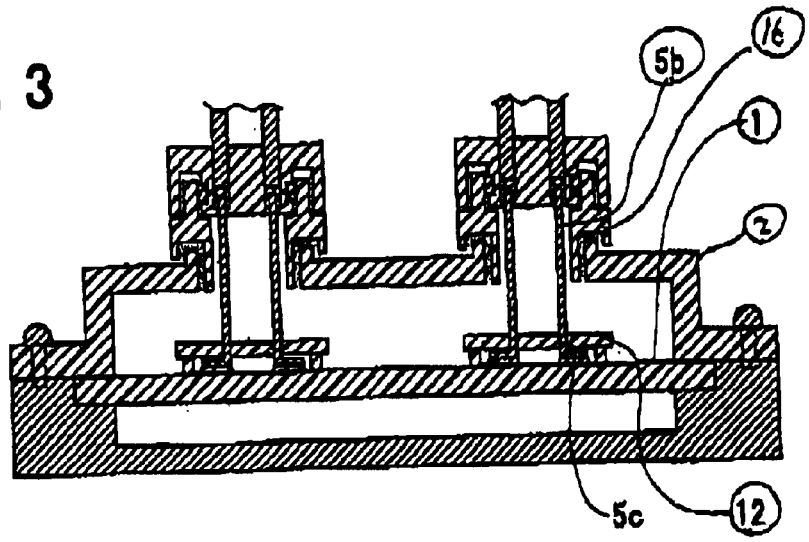
FIG. 3
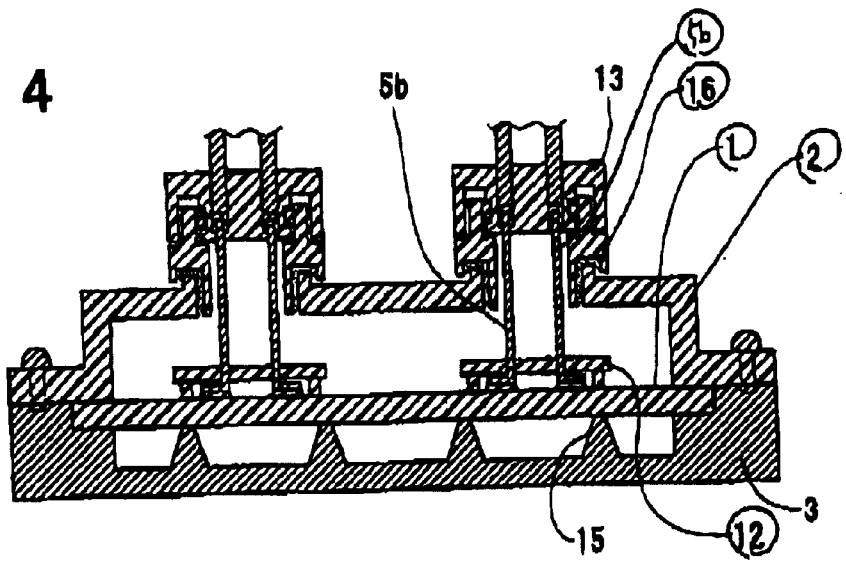
FIG. 4
FIG. 5 RELATED ART
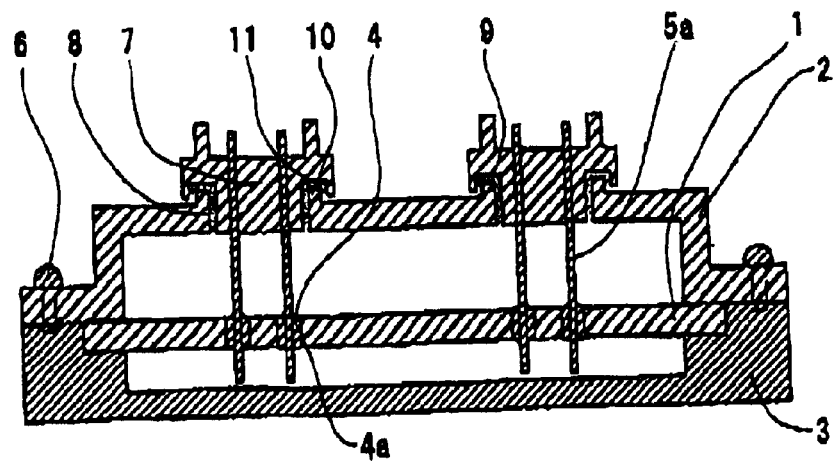

US 6,755,677 B2

ELECTRONIC CIRCUIT UNIT HAVING A PENETRATION-TYPE CONNECTOR HOUSING

CROSS REFERENCE TO RELATED APPLICATION

This application is based on and incorporates herein by reference Japanese Patent Application No. 2002-41333 filed on Feb. 19, 2002.

FILED OF THE INVENTION

The present invention relates to an electronic circuit unit, which may be equipped in an engine compartment and used for controlling an engine and so on, including electric connectors in a body, and a manufacturing method therefor.

BACKGROUND OF THE INVENTION

Recently, since an electronic circuit unit for an engine has many functions, electric connectors for external devices in the electronic circuit unit have increased. Since the electronic circuit unit is installed in the engine compartment of a car, the size of the electronic circuit unit should be made small. Therefore, the electric connectors are formed inside the electronic circuit unit.

It is proposed as shown in FIG. 5 that each group of connector pins 5 for an electrical connection with an external device are insert-molded in a normal-type connector housing 7. Each normal-type connector housing 7 is fixed in each opening 8 formed in a case 2 by an adhesive. By fitting a projection 10 formed in each opening 8 to a recess 11 formed in the circumference of the normal-type connector housing 7, the normal-type connector housing 7 is fixed to the case 2. The end of each connector pin 5 on the side of the printed wiring board is inserted in a through hole 4a and fixed by a solder 4. The printed wiring board 1 is sandwiched by the case 2 and a base 3, and they are fixed by screws 6. That is, the normal-type connector housings 7, which are respectively installed groups of connector pins, and the case 2 are formed in a single body, and the united single body is installed to the printed wiring board in a moss.

However, when there are many electric connectors, it is difficult to install the united single body to the printed wiring board so that each group of the connector pins 5 correspond to the respective through holes 4a. This is because the normal-type connector housing 7 is not always fixed in the case 2 correctly and positions of the ends of the connector pins 5 do not correspond to the positions of the through holes 4a in setting of the united single body.

The connector pins 5 can be simultaneously inserted in the through holes 4a when the diameters of the through holes are made larger. However, it is difficult to fill the through holes with the solder 4.

SUMMARY OF THE INVENTION

It is an object of the present invention to provide an electronic circuit unit having an improved connector structure and a manufacturing method therefor.

An electronic circuit unit according to the invention has at least one penetration-type connector housing, which can be pierced by a group of connector pins with clearances against inner surface. Moreover, in correspondence with each penetration-type connector housing, a plate to support a group of connector pins is formed. Therefore, in a manufacturing process to set many groups of the connector pins to a printed wiring board, the method is easy and secure.

BRIEF DESCRIPTION OF THE DRAWINGS

The above and other objects, features and advantages of the present invention will become more apparent from the following detailed description made with reference to the accompanying drawings. In the drawings:

FIG. 3 is a sectional view of an electronic circuit unit according to the third embodiment of the present invention:

FIG. 4 is a sectional view of an electronic circuit unit according to the fourth embodiment of the present invention: and FIG. 5 is a sectional view of an electronic circuit unit according to a related art.

DETAILED DESCRIPTION OF THE PREFERRED EMBODIMENT

[First Embodiment]

Figure 1:
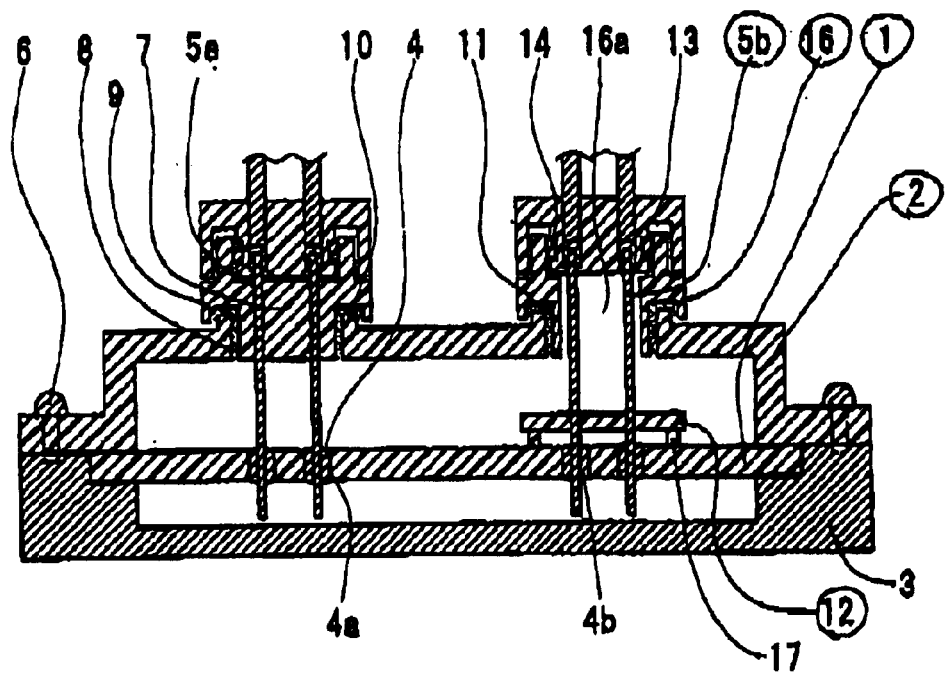
FIG. 1 is a sectional view of an electronic circuit unit according to the first embodiment of the present invention.

A printed wiring board 1 shown in FIG. 1, which has an electric circuit (not shown) and a conductor pattern as a wiring on its surface, is made of an epoxy resin including glass fibers. On the printed wiring board 1, the conductor pattern is made by etching a cooper film, the thickness of which is about 35 $\mu$m.

The printed wiring board 1 has through holes 4a and 4b to insert connector pins 5a and 5b for electrical connections with external devices such as sensors and actuators (not shown).

Each connector pin 5a and 5b is made of a copper-zinc material. The ends of the connector pins 5a and 5b are plated with solder, tin and so on, and the other ends of the connector pin 5a and 5b are plated with the gold. The end of the connector pins 5a and 5b are fixed in the corresponding through hole 4a and 5b of the printed wiring board 1 by soldering. In the soldering, solder 4 that is eutectic solders includes tin and lead.

The printed wiring board 1 and the connector pins 5a and 5b are accommodated in a housing composed of a case 2 and a base 3. The base 3 is made of a resin material, an AL die-casting material or the like. The case 2 is made of a resin material like PBT (polybutylene terephthalate), which possesses superior durability, high stiffness and anti-cleaving and so on. In the case 2, openings 8 are formed and a projection 9 is formed to surround each opening 8.

In the opening 8, a normal-type connector housing 7 and a penetration-type connector housing 16 for the connections with connectors of the external devices are fixed. The connector housing 7 is insert-molded with the connector pins 5a, but the connector housing 16 surrounds the connector pins 5b with clearances. The connector housings 7 and 16 can be made of the same resin as the case 2. In this embodiment, the connector housings 7, 16 and case 2 are made respectively. Otherwise, they may be made as a single piece.

In the normal-type connector housing 7, a group of the connector pins 5a are insert-molded facing with the through holes 4a formed in the printed wiring board 1. A recess 11 is formed in the circumference of each connector housing 7 to fit a projection 10.

The penetration-type connector housing 16 has a large penetrated hole 16a in the center. Similarly to the normal-type connector housing 7, the penetration-type connector housing 16 has a recess 11 in the circumference.

The electronic circuit unit shown in FIG. 1 has one normal-type connector housing 7 and one penetrated-type connector 16. When the electronic circuit unit needs more than two connector housings, two or more penetration-type connectors 16 are formed.

The connector pins 5*b* penetrating the connector housing 16 are supported by a plate 12. The plate 12 is insert-molded by connector pins 5*b*. However, in the inserting, the positions of the connector pins 5*b* should be fixed in the positions to correspond to through holes 4*b* made in the printed wiring board 1. In this embodiment, legs 17 are formed on the plate facing with the printed wiring board 1. The legs can be formed in a peace with the plate 12, or they can form by attaching together after being made respectively.

The ends of the connector pins 5*b* supported by the plate 12 are inserted in the through holes 4*a* formed in the printed wiring board 1 and fixed there by soldering. In this instance, the connector pins 5*b* are inserted until the leg portion 17 faces the surface of the printed wiring board 1.

The connector housing 7 installed connector pins 5*a* and the connector housing 16 are fixed in the openings 8 of the case 2 by an adhesive 9. Then, the recess 11, which is formed in each of the connector housing 7 and the connector housing 16, is fit to the projection 10 formed in each opening 8 of the case 2. The projection 10 and the recess 11 guide the connector housings 7 and 16 to fit to the case 2.

The case 2 including the connector housings 7 and 16 is set on the surface of the printed wiring board 1 so that the edge of the printed wiring board 1 and the edge of the case 2 are faced together. By that, the connector pins 5*b* fixed by the plate 12 on the printed wiring board 1 pierce over the large penetrated hole 16*a* of the connector housing 16. The lower ends of the connector pins 5 of the housing 7 are inserted in the through holes 4*a* formed in the printed wiring board 1 and fixed by soldering. The positions of the connector pins 5*a* insert-molding the connector housing 7 can be easily corresponded to the positions of the through holes 4*a* in the printed wiring board 1, because the connector pins 5*a* and the holes 4*a* are less than the total. Therefore, even though the connector housing 7 is installed to the case 2 a little inaccurately, the case 2 installed connector housings 7 and 16 can be set to the printed wiring board 1 without problems.

The printed wiring board 1 united with case 2 is put on the base 3 fitly and fixed by screws 6. The ends of the printed wiring board 1 are sandwiched by the case 2 and the base 3, and the whole body of the printed wiring board 1 is accommodated in the housing formed with the case 2 and the base 3.

When more than two electrical connectors with external devices are needed, at least one penetration-type connector housing 16 should be made. Then, the positions of each group of connector pins 5*b* are defined by the respective plates 12. More, since the connector pins 5*b* are separated from the connector housing 16, the connector pins 5*b* can be inserted to the through holes 4*b* and soldered before setting the case 2 to the printed wiring board 1. That is, steps of inserting connector pins or soldering can be easy. Furthermore by that, a group of the connector pins 5*b* supported by the plate 12 do not influence insetting a group of connector pins 5*a* installed in the connector housing 7 to the through holes 4*a*. Therefore, it is easy to set the connector pins 5*a* and 5*b* to the printed wiring board 1.

By the legs 17 on the plate 12, since some space is formed between the plate 12 and the printed wiring board 1, solder fillets can be formed in the space. That is suitable for gluing by the solder.

When more than two connector housings are needed, more penetration-type connector housings may be equipped. Then, it can be easy to insert connector pins in the through holes of the printed wiring board 1 by using more penetration-type connector housings.

Since the electronic circuit unit is equipped in an engine compartment, there is a possibility that water invades the electronic circuit unit through a large penetrated hole 16*a* of the connector housing 16. To prevent the invasion, a seal 14 made of a rubber material is formed in the female connector 13 of an external device. By the seal 14, when there is a clearance, it is prevented that water enters the electronic circuit unit.

[Second Embodiment]

Figure 2:
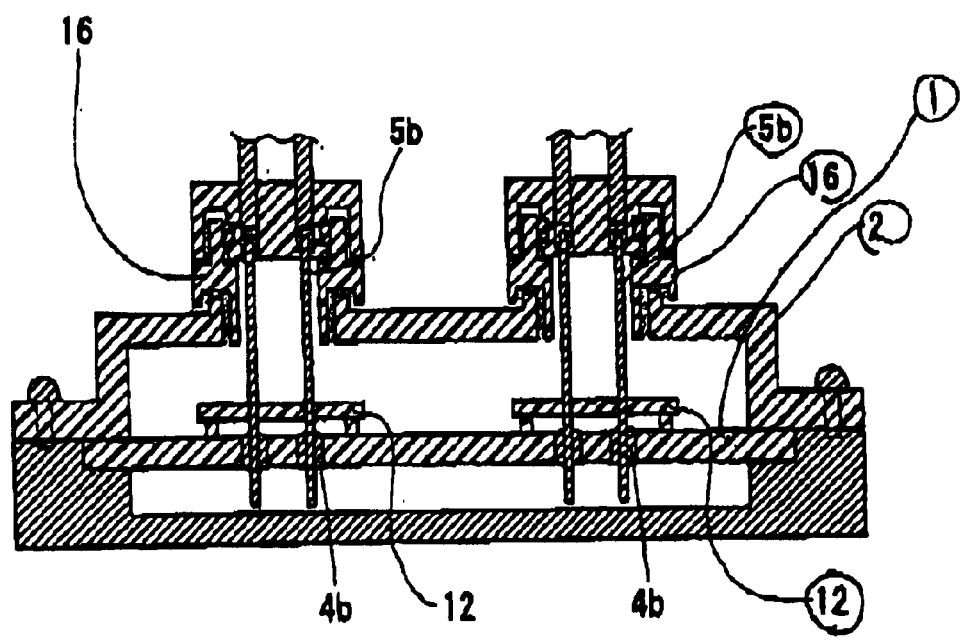
FIG. 2 is a sectional view of an electronic circuit unit according to the second embodiment of the present invention.

In this embodiment shown in FIG. 2, all electric connectors are composed of the penetration-type connector housings 16, the plates 12 and the connector pins 5*b*.

Thus, in a step to install the connector pins 5*b*, the case 2 can be installed at last after all groups of connector pins 5*b* and a plate are installed in the printed wiring board. Therefore, a manufacturing step to insert the connector pins 5*b* in the through holes 4*b* can be easy, and the capacity of fixations by soldering can be improved.

[Third Embodiment]

In this embodiment shown in FIG. 3, the lower ends of the connector pins 5*b* are bent under each plate 12, and bent ends 5*c* are fixed by soldering on the printed wiring board 1.

The through holes to insert the connector pins 5*b* need not be formed on the printed wiring board 1, and a step to pass the connector pins 5*b* through the through holes is omitted. Moreover, since areas to be soldered can be secured sufficiently, the toughness of the soldered parts is improved.

[Fourth Embodiment]

In this embodiment shown in FIG. 4, on the surface of the base 3 toward the printed wiring board 1, projections 15 are formed. The projections 15 are arranged to support the parts soldered. The projections 15 may be formed in a single piece with the base 3. Otherwise, they can be attached together after being made separately. However, the projections 15 should not be higher than the distance between the printed wiring board 1 and the base 3. Because, the circumference of the printed wiring board 1 is fixed between the case 2 and the base 3, and the printed wiring board 1 should not be bent by the projections 15. When the penetration-type connector housing 16 is fit in the female connector 13, the printed wiring board 1 is pressed strongly by the connector pins 5*b*. Therefore, soldered portions in the printed wiring board 1 are pressed strongly, and the printed wiring board 1 is bent by the connector pins 5*b*. However, by the supports of the projections 15, it is prevented that the printed wiring board 1 is bent when the external devices are connected.

The projections 15 can be similarly provided in the bases 3 of the foregoing embodiments. It is ideal that clearances are formed between the legs 17 formed in the plates 12 and the printed wiring boards 17 when connector pins 5*b* are fixed on the printed wiring boards 1 by solder. This is for the prevention, in a temperature changing condition, that the stress caused by the difference of the transformations of the plate 12 including the legs 17 and the connector pins 5*b* affects the soldering portions of the connector pins 5*b*.

When the printed wiring board 1 is fixed, it does not always have to be fixed by being sandwiched between the case 2 and the base 3. It can be fixed by the screws on the case 2 or base 3. The present invention should not be limited to the above disclosed embodiments that may be modified further without departing from the spirit of the invention.

What is claimed is:

1. An electronic circuit unit capable of being connected with an external device having a plurality of connectors, the electronic circuit unit comprising:
   a printed wiring board;
   one or more groups of connector pins for electrically connecting the printed wiring board directly with the external device;
   one or more connector housings pierced by the one or more groups of connector pins, wherein
      at least one of the one or more connector housings is a penetration-type connector housing having an open through hole and is pierced by the one or more groups of connector pins with clearances against the one or more connector housings;
      one end of each of the one or more groups of connector pins projects from an outer surface of the connector housing and is connectable with a corresponding connector of the external device;
   plates each supporting at least one of the one or more groups of connector pins in correspondence with the penetration-type connector housing; and
   a case accommodating the printed wiring board and set with the connector housings thereon.

2. An electronic circuit unit according to claim 1, wherein all of the one or more connector housings are the penetration-type connector housings and all of the groups of connector pins are supported by the plates respectively.

3. An electronic circuit unit according to claim 1, wherein each plate is spaced from the printed wiring board, and the group at least one of the one or more groups of connector pins held by the plate is fixed on the printed wiring board.

4. An electronic circuit unit according to claim 1, wherein ends of the one or more groups of connector pins are bent, and the bent ends are fixed on a surface of the printed wiring board.

5. An electronic circuit unit according to claim 1, further comprising:
   a base to sandwich a circumference of the printed wiring board with the case; and
   a projection on a surface of the base to face the printed wiring board, wherein the projection supports the printed wiring board at a part inside of the circumference of the printed wiring board.

6. An electronic circuit unit according to claim 1, wherein a remaining connector housing other than the at least one of the one or more connector housings is a normal-type connector housing in which a corresponding group of the one or more groups of connector pins are insert-molded.

7. A method of producing an electronic circuit unit comprising steps of:
   inserting a first group of connector pins fixedly held by a plate into a printed wiring board, the plate being separated from a first connector housing having a through hole;
   fixing the first connector housing and a second connector housing in a first through hole and a second through hole of a case, respectively, the second connector housing being insert-molded with a group of second connector pins; and
   fixing the case to the printed wiring board while inserting the second group of connector pins into the printed wiring board and surrounding the first group of connector pins with the first connector housing.

8. A method of producing an electronic circuit unit comprising steps of:
   inserting first and second groups of connector pins fixedly held by first and second plates into a printed wiring board, respectively;
   fixing first and second connector housings in first and second through holes of a case, respectively, the first and second connector housings being separate from the first and second plates, respectively; and
   fixing the case to the printed wiring board while surrounding the first and second groups of connector pins with the first and second connector housings, respectively.

9. An electronic circuit unit to be connected with an external device having a plurality of connectors, the electronic circuit unit comprising:
   a printed wiring board;
   a group of connector pins electrically connecting the printed wiring board with the external device, wherein one end of each connector pins is fixed to the printed wiring board;
   a connector housing pierced by the group of the connector pins, wherein
      the connector housing is a penetration-type connector housing, which has an open through hole pierced by the group of connector pins with clearances against the connector housing; and
      the other end of each connector pin projects outward from an outer surface of the connector housing and is connected with and fixed by a corresponding connector of the external device,
   a plate fixedly supporting the group of the connector pins in correspondence with the penetration-type connector housing; and
   a case accommodating the printed wiring board and set with the connector housing thereon.

10. An electronic circuit unit according to claim 7, wherein the plate is spaced from the printed wiring board, and the group of connector pins fixedly supported by the plate is fixed on the printed wiring board.

* * * * *